(12) United States Patent
Komatsu

(10) Patent No.: US 10,535,717 B2
(45) Date of Patent: Jan. 14, 2020

(54) ORGANIC LIGHT-EMITTING DEVICE

(71) Applicant: JOLED INC., Tokyo (JP)

(72) Inventor: Takahiro Komatsu, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/018,882

(22) Filed: Jun. 26, 2018

(65) Prior Publication Data

US 2018/0308906 A1 Oct. 25, 2018

Related U.S. Application Data

(63) Continuation of application No. 15/318,013, filed as application No. PCT/JP2015/003089 on Jun. 19, 2015, now Pat. No. 10,038,034.

(30) Foreign Application Priority Data

Jun. 20, 2014 (JP) ................................. 2014-127075

(51) Int. Cl.
*H01L 29/08* (2006.01)
*H01L 27/32* (2006.01)
(Continued)

(52) U.S. Cl.
CPC ...... *H01L 27/3206* (2013.01); *H01L 51/5072* (2013.01); *H01L 51/5088* (2013.01);
(Continued)

(58) Field of Classification Search
CPC . H01L 51/50; H01L 51/5072; H01L 51/5088; H01L 51/5218; H01L 51/5092; H01L 27/3206
See application file for complete search history.

(56) References Cited

U.S. PATENT DOCUMENTS 5,443,922 A 8/1995 Nishizaki et al.
5,783,292 A 7/1998 Tokito et al.
(Continued)

FOREIGN PATENT DOCUMENTS

JP 05-163488 6/1993
JP 08-102360 4/1996
(Continued)

OTHER PUBLICATIONS

International Search Report (ISR) in International Pat. Appl. No. PCT/JP2015/003089, dated Sep. 15, 2015.

*Primary Examiner* — Phuc T Dang
(74) *Attorney, Agent, or Firm* — Greenblum & Bernstein, P.L.C.

(57) ABSTRACT

A plurality of light emitters emitting different colors of light in a light-emitting device is provided on a surface of a substrate along two dimensions. Each light emitter includes a first electrode, a first charge injection/transport layer, a light-emitting layer, an intermediate layer, a second charge injection/transport layer, and a second electrode. The intermediate layer includes a fluoride of an alkali metal or an alkaline earth metal. Among the first electrode and the second electrode, one electrode is light reflective and another electrode is light transmissive. Among the first charge injection/transport layer and the second charge injection/transport layer, one charge injection/transport layer is disposed between the light-emitting layer and the light reflective electrode, and thickness of the one charge injection/transport layer included in the first light emitter is different from thickness of the one charge injection/transport layer included in the second light emitter.

15 Claims, 8 Drawing Sheets

(51) Int. Cl.
   *H01L 51/50*  (2006.01)
   *H01L 51/52*  (2006.01)
(52) U.S. Cl.
   CPC ...... *H01L 51/5092* (2013.01); *H01L 51/5218* (2013.01); *H01L 51/5221* (2013.01); *H01L 51/5265* (2013.01)

(56) References Cited

U.S. PATENT DOCUMENTS

| | | | |
|---|---|---|---|
| 9,006,755 B2 | 4/2015 | Seo | |
| 9,755,001 B2 | 9/2017 | Seo | |
| 2002/0004146 A1 | 1/2002 | Kido et al. | |
| 2002/0118182 A1 | 8/2002 | Luther Weindorf | |
| 2004/0174321 A1 | 9/2004 | Takei | |
| 2006/0066224 A1 | 3/2006 | Ito | |
| 2007/0210705 A1 | 9/2007 | Yokoi et al. | |
| 2008/0008905 A1 | 1/2008 | Yamazaki | |
| 2009/0039777 A1 | 2/2009 | Oda | |
| 2009/0078946 A1* | 3/2009 | Jeong | H01L 51/5203 257/94 |
| 2011/0101398 A1* | 5/2011 | Uchida | H01L 27/3211 257/98 |
| 2011/0180792 A1 | 7/2011 | Lee et al. | |
| 2012/0091482 A1 | 4/2012 | Uchida | |
| 2013/0134410 A1 | 5/2013 | Kim | |
| 2014/0020760 A1* | 1/2014 | Kato | H01L 51/0036 136/263 |
| 2014/0042928 A1 | 2/2014 | Shikina | |
| 2014/0295179 A1 | 10/2014 | Naito | |
| 2014/0319487 A1 | 10/2014 | Park | |
| 2014/0332790 A1* | 11/2014 | Fadhel | H01L 51/0072 257/40 |
| 2015/0028310 A1* | 1/2015 | Dai | H01L 27/3246 257/40 |
| 2015/0069357 A1* | 3/2015 | Park | H01L 51/508 257/40 |
| 2015/0115231 A1 | 4/2015 | Lee | |

FOREIGN PATENT DOCUMENTS

| | | |
|---|---|---|
| JP | 08-228069 | 11/1996 |
| JP | 11-162646 | 6/1999 |
| JP | 11-233262 | 8/1999 |
| JP | 2004-288621 | 10/2004 |
| JP | 2007-035920 | 2/2007 |
| JP | 2008-034367 | 2/2008 |
| JP | 2009-043466 | 2/2009 |
| JP | 2010-050014 | 3/2010 |
| JP | 2012-504847 | 2/2012 |
| JP | 4882508 | 2/2012 |
| WO | 2006/080315 | 8/2006 |

* cited by examiner

ORGANIC LIGHT-EMITTING DEVICE

CROSS REFERENCES TO RELATED APPLICATIONS

This Application is a continuation application of the pending U.S. patent application Ser. No. 15/318,013, filed on Dec. 12, 2016, which is a National Stage Application of PCT/JP20151003089, filed on Jun. 19, 2015, which claims priority from Japanese Patent Application No. 2014-127075, filed on Jun. 20, 2014, the contents of which are hereby incorporated by reference in their entireties.

TECHNICAL FIELD

The present invention relates to organic light-emitting devices and display apparatuses, and in particular to improving light emission efficiency.

BACKGROUND ART

In recent years, organic light-emitting devices such as organic electroluminescence (EL) panels and organic EL lighting have been actively developed.

An organic EL panel has a configuration in which sub-pixels are arranged in two dimensions on a surface of a substrate. Each sub-pixel has a layered configuration in which an anode, a hole injection layer (HIL), a hole transport layer, an organic light-emitting layer, an electron transport layer, and a cathode are layered in this order on the substrate. The hole injection layer, hole transport layer, and electron transport layer have a function of injecting a charge (electrons, holes) from the anode or cathode to the organic light-emitting layer or a function of transporting a charge from the anode or cathode to the organic light-emitting layer, and therefore these layers are referred to as charge injection/transport layers.

Here, as an electron transport layer, the use of an organic material layer doped with barium, for example, has been studied and developed. By using such an electron transport layer, high electron injectability can be achieved.

Further, in view of the problem of degradation of a charge injection/transport layer easily occurring due to impurities (moisture and oxygen), Patent Literature 1 discloses a configuration in which a barrier layer formed from an inorganic material is disposed between the organic light-emitting layer and the electron transport layer. As an inorganic material disclosed in Patent Literature 1, an example is silicon oxide ($SiO_x$).

CITATION LIST

Patent Literature

[Patent Literature 1] Japanese patent 4882508

SUMMARY OF INVENTION

Technical Problem

However, when the barrier layer formed from the inorganic material is disposed between the organic light-emitting layer and the electron transport layer, a technical problem occurs in that light emission efficiency decreases. This is thought to be because the inorganic material disclosed in Patent Literature 1 has low electron injectivity and a barrier layer is a barrier that inhibits injection of electrons to the organic light-emitting layer.

In order to suppress such a decrease in electron injectivity, configurations have been developed that use a layer including an organic material doped with an alkali metal or alkaline earth metal as the electron transport layer, and an intermediate layer including a fluoride of an alkali metal or alkaline earth metal between the organic light-emitting layer and the electron transport layer.

Such an intermediate layer has a function of blocking impurities and is thought to achieve high electron injectivity.

Although the above configuration attempts to suppress a decrease in light emission efficiency, a further increase is sought in light emission efficiency for organic light-emitting devices such as organic EL panels.

The present invention aims to provide an organic light-emitting device and a display apparatus that suppress degradation of a charge injection/transport layer caused by impurities while improving light emission efficiency.

Solution to Problem

An organic light-emitting device pertaining to one aspect of the present invention is an organic light-emitting device comprising a plurality of light emitters arranged in two dimensions along a surface of a substrate. Each light emitter of the plurality of light emitters comprises: a first electrode disposed above the substrate; a first charge injection/transport layer disposed above the first electrode; an organic light-emitting layer disposed above the first charge injection/transport layer, an intermediate layer disposed above the organic light-emitting layer; a second charge injection/transport layer disposed on the intermediate layer; and a second electrode disposed above the second charge injection/transport layer. The intermediate layer includes a fluoride of an alkali metal or a fluoride of an alkaline earth metal. The second charge injection/transport layer includes an organic material doped with an alkali metal or an alkaline earth metal. Of the first electrode and the second electrode, one electrode is light reflective and the other electrode is light transmissive. The plurality of light emitters include a first light emitter and a second light emitter that emits a different color of light than the first light emitter. Of the first charge injection/transport layer and the second charge injection/transport layer, one charge injection/transport layer is disposed between the organic light-emitting layer and the one electrode, and thickness of the one charge injection/transport layer in the first light emitter is different from thickness of the one charge injection/transport layer in the second light emitter.

Advantageous Effects of Invention

According to the organic light-emitting device pertaining to one aspect of the present invention, a layer including an organic material doped with an alkali metal or alkaline earth metal is used as a second charge injection/transport layer, and therefore a high light emission efficiency is achieved.

Further, an intermediate layer, which is a layer including a fluoride of an alkali metal or a fluoride of an alkaline earth metal, is disposed between the organic light-emitting layer and the second charge injection/transport layer, and therefore a high impurity blocking property is achieved. Thus, impurities from the organic light-emitting layer are effectively blocked from entering the charge injection/transport layer, degradation of the charge injection/transport layer is suppressed, and a high storage stability can be achieved. Thus, high charge injectability of the organic light-emitting device can be achieved.

Further, the organic light-emitting device pertaining to the above aspect includes a first light emitter and a second light emitter that emits a different color of light than the first light emitter. Further, thickness of the one charge injection/transport layer between the one electrode that is light-reflective and the organic light-emitting layer in the first light emitter is different from thickness of the one charge injection/transport layer in the second light emitter. Thickness of the one charge injection/transport layer affects a difference in optical path length between directly-emitted light that is emitted externally from the organic light-emitting layer and reflected-emitted light that is reflected at the one electrode and emitted externally. According to the organic light-emitting device pertaining to the above aspect, thickness of the one charge injection/transport layer between the electrode that is light-reflective and the organic light-emitting layer in the first light emitter is different from thickness of the one charge injection/transport layer in the second light emitter and therefore between the first light emitter and the second light emitter the same film thickness is not formed in common. Accordingly, cavity adjustment is performed to obtain a resonance effect between directly-emitted light and reflected-emitted light in each of the first light emitter and the second light emitter, and therefore light emission efficiency can be improved for each of the first light emitter and the second light emitter.

Thus, the organic light-emitting device pertaining to the above aspect suppresses degradation of the charge injection/transport layer due to impurities while further improving light emission efficiency.

EMBODIMENT

Summary of Aspects of Present Invention

Figure 1:
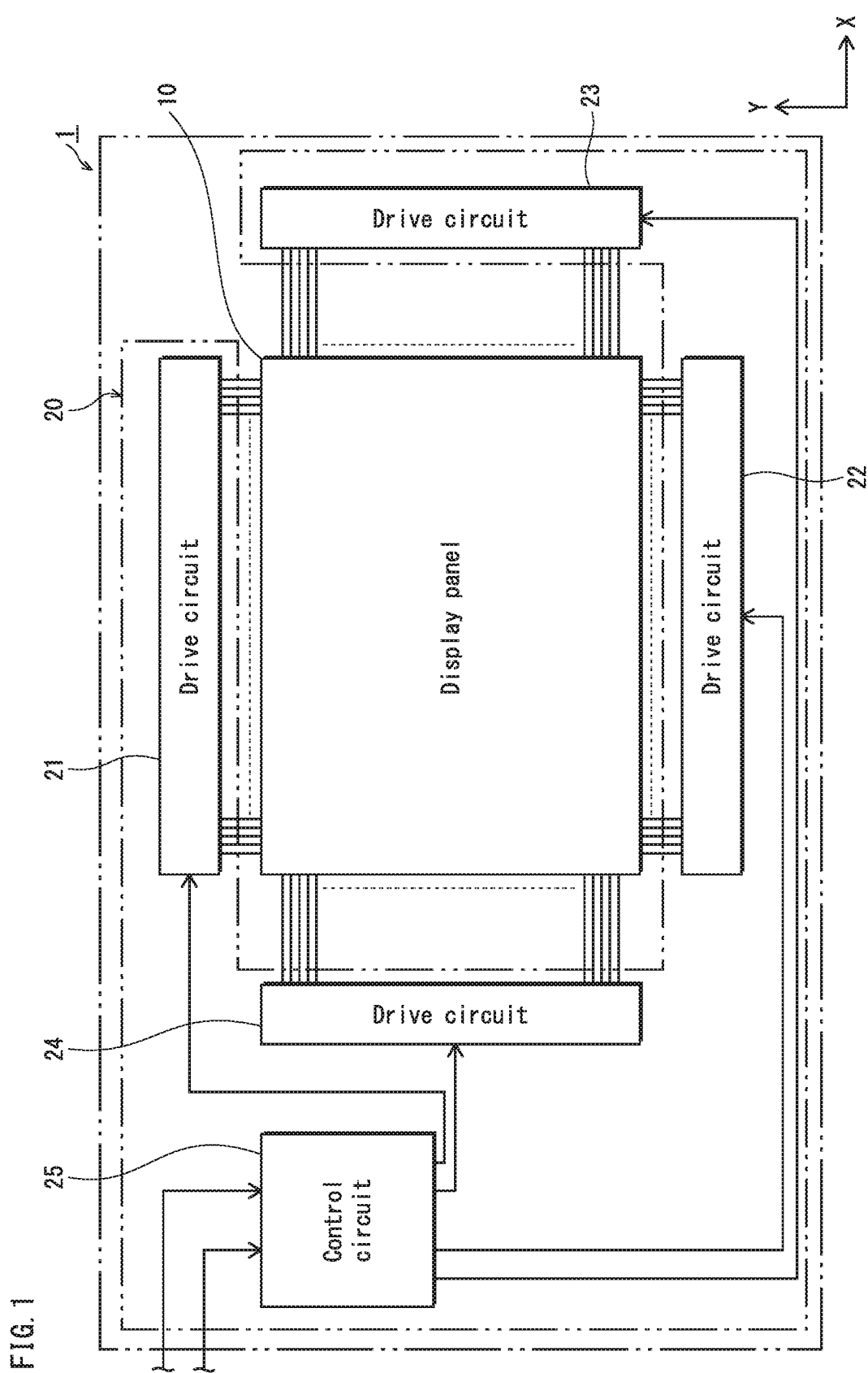
FIG. 1 is a schematic block diagram showing a schematic configuration of an organic EL display apparatus pertaining to an embodiment of the present invention.

An organic light-emitting device pertaining to one aspect of the present invention is an organic light-emitting device comprising a plurality of light emitters arranged in two dimensions along a surface of a substrate. Each light emitter of the plurality of light emitters comprises: a first electrode disposed above the substrate; a first charge injection/transport layer disposed above the first electrode; an organic light-emitting layer disposed above the first charge injection/transport layer; an intermediate layer disposed above the organic light-emitting layer; a second charge injection/transport layer disposed on the intermediate layer; and a second electrode disposed above the second charge injection/transport layer. The intermediate layer includes a fluoride of an alkali metal or a fluoride of an alkaline earth metal. The second charge injection/transport layer includes an alkali metal or an alkaline earth metal. Of the first electrode and the second electrode, one electrode is light reflective and the other electrode is light transmissive. The plurality of light emitters include a first light emitter and a second light emitter that emits a different color of light than the first light emitter. Of the first charge injection/transport layer and the second charge injection/transport layer, one charge injection/transport layer is disposed between the organic light-emitting layer and the one electrode, and thickness of the one charge injection/transport layer in the first light emitter is different from thickness of the one charge injection/transport layer in the second light emitter.

According to the organic light-emitting device pertaining to one aspect of the present invention, the second charge injection/transport layer includes an alkali metal or alkaline earth metal, and therefore a high light emission efficiency can be achieved at a low drive voltage.

Further, an intermediate layer, which is a layer including a fluoride of an alkali metal or a fluoride of an alkaline earth metal, is disposed between the organic light-emitting layer and the second charge injection/transport layer, and therefore a high impurity blocking property is achieved. Thus, entry of impurities from the organic light-emitting layer to the second charge injection/transport layer and the second electrode can be effectively blocked, suppressing degradation of the second charge injection/transport layer and the second electrode, and high charge injectivity can be maintained. Further, an organic light-emitting device that has a high storage stability can be achieved.

Further, the organic light-emitting device pertaining to the above aspect includes a first light emitter and a second light emitter that emits a different color of light than the first light emitter. Thickness of the one charge injection/transport layer in the first light emitter is different from thickness of the one charge injection/transport layer in the second light emitter. That is, the above layers are formed separately in the first light emitter and the second light emitter, and therefore cavity adjustment can be performed for each of the first light emitter and the second light emitter, and resonance effects of each allow improvement of light emission efficiency.

Thus, the organic light-emitting device pertaining to the above aspect suppresses degradation of the charge injection/transport layer due to impurities while improving light emission efficiency.

Further, for each light emitter of the plurality of light emitters, the thickness of the one charge injection/transport layer may be a thickness that achieves a resonance effect, based on a wavelength of a light emission color of the light emitter.

Thus, light emission efficiency can be further improved due to resonance effects in each light emitter.

Further, the one charge injection/transport layer may have a lower electrical resistivity than the organic light-emitting layer.

Thus, when compared with performing cavity adjustment by increasing thickness of the organic light-emitting layer, an increase in drive voltage is suppressed, the increase occurring when film thickness is increased to perform cavity adjustment.

Further, the one charge injection/transport layer may be formed by a wet process using an organic material.

Thus, film thickness of the layers for cavity adjustment for each light emitter can easily be altered.

Further, when the alkali metal or alkaline earth metal of the fluoride included in the intermediate layer is a first metal and the alkali metal or alkaline earth metal included in the second charge injection/transport layer is a second metal, the second metal may have a property of cleaving a bond between the first metal and fluorine in the fluoride of the first metal.

Thus, by inhibiting entry of impurities from the side of the organic light-emitting layer to the second charge injection/transport layer and the second electrode, excellent storage stability can be achieved. Further, the second metal included in the second charge injection/transport layer cleaves a bond between the first metal and fluorine, releasing the first metal. The released first metal is an alkali metal or alkaline earth metal and has excellent electron injection properties, and therefore excellent light emission efficiency can be achieved.

Further, an alkali metal or alkaline earth metal that has a relatively low work function and high electron supply capacity is used as the second metal, and therefore reactivity with fluorine is relatively high, and a bond between the first metal and fluorine is easily cleaved. Accordingly, electron injectivity of the first metal is more effective, and an excellent light emission efficiency is achieved.

Further, the second charge injection/transport layer may be formed from an organic material doped with the second metal.

Thus, the second metal dopant in the second charge injection/transport layer acts on the fluoride of the first metal included in the intermediate layer.

Further, the second charge injection/transport layer may be formed from a first layer made from the second metal and a second layer that includes an organic material, wherein the first layer is disposed in contact with the intermediate layer.

Thus, the first layer is formed from the second metal, and therefore the second metal acts on the fluoride of the first metal included in the intermediate layer at a higher concentration.

Further, the second layer may be formed from the organic material doped with an alkali metal or alkaline earth metal.

Thus, charge injection/transport properties of the second layer can be improved.

Further, the alkali metal or alkaline earth metal used to dope the organic material in the second layer may be the second metal.

Thus, the same metal material can be used in forming the first layer and the second layer, making manufacture simpler and decreasing costs.

Further, the organic material in the second layer need not include a metal dopant.

Thus, a process of adding a metal dopant to the second layer can be eliminated, simplifying manufacture and reducing costs.

Further, the first electrode may be an anode, the second electrode a cathode, the first charge injection/transport layer a hole injection layer, and the second charge injection/transport layer an electron transport layer.

Thus, impurities from the organic light-emitting layer side are further hindered by the intermediate layer from entering the cathode, which is the second electrode, and the electron transport layer, which is the second charge injection/transport layer, degradation of the cathode and the electron transport layer by impurities is suppressed, and excellent storage stability can be achieved.

Further, the first electrode may be reflective, the first charge injection/transport layer may be formed from an electrically-conductive organic material, and thickness of the first charge injection/transport layer in the first light emitter may be different from thickness of the first charge injection/transport layer in the second light emitter.

Thus, the hole injection layer, which is the first charge injection/transport layer, is formed from an organic material, and therefore the hole injection layer can be easily formed by using a wet process. Accordingly, in the case of a structure in which surfaces of the anode, which is the first electrode, reflect light, and light is extracted from the side of the cathode, which is the second electrode, the hole injection layer can easily be formed at different film thicknesses in the first light emitter and the second light emitter in order to perform cavity adjustment.

Further, the second electrode may be light reflective, and the second charge injection/transport layer may be formed from a π-electron system organic material including an alkali metal or an alkaline earth metal.

Thus, the electron transport layer, which is the second charge injection/transport layer, is formed from a π-electron system organic material, and therefore the electron transport layer can be formed by using a wet process. Accordingly, in the case of a structure in which surfaces of the anode, which is the first electrode, reflect light, and light is extracted from the side of the cathode, which is the second electrode, the electron transport layer can be formed at different film thicknesses in the first light emitter and the second light emitter in order to perform cavity adjustment.

Further, the first electrode may be a cathode, the second electrode an anode, the first charge injection/transport layer an electron transport layer, and the second charge injection/transport layer a hole injection layer.

Thus, impurities from the organic light-emitting layer side are further hindered by the intermediate layer from entering the anode, which is the second electrode, and the hole injection layer, which is the second charge injection/transport layer, degradation of the anode and the hole injection layer by impurities is suppressed, and excellent storage stability can be achieved.

Further, the first electrode may be light reflective, and the first charge injection/transport layer may be formed from a π-electron system organic material including an alkali metal or an alkaline earth metal.

Thus, the electron transport layer, which is the first charge injection/transport layer, is formed from a π-electron system organic material, and therefore the electron transport layer can be formed by using a wet process. Accordingly, in the case of a structure in which surfaces of the cathode, which is the first electrode, reflect light, and light is extracted from the side of the anode, which is the second electrode, the electron transport layer can easily be formed at different film thicknesses in the first light emitter and the second light emitter in order to perform cavity adjustment.

Further, the second electrode may be light reflective, and the second charge injection/transport layer may be formed from an electrically-conductive organic material.

Thus, the hole injection layer, which is the second charge injection/transport layer, is formed from an electrically-conductive organic material, and therefore the hole injection layer can be easily formed by using a wet process. Accordingly, in the case of a structure in which surfaces of the anode, which is the second electrode, reflect light, and light is extracted from the side of the cathode, which is the first electrode, the hole injection layer can be formed at different film thicknesses in the first light emitter and the second light emitter in order to perform cavity adjustment.

Further, a wavelength of light emission color of the first light-emitter may be longer than a wavelength of light emission color of the second light-emitter, and thickness of the one charge injection/transport layer in the first light emitter may be greater than thickness of the one charge injection/transport layer in the second light emitter.

Thus, for the first light emitter that has a longer wavelength of light-emission color than the second light emitter, a longer optical path can be ensured, and light emission efficiency improved through a resonance effect.

Further, a display apparatus pertaining to another aspect of the present invention comprises: a display panel; and control/drive circuitry connected to the display panel, wherein the display panel uses any organic light-emitting device structure described above.

Thus, the display apparatus pertaining to another aspect of the present invention also achieves the same effects as the organic light-emitting device described above.

The following provides specific examples of an embodiment and modifications of the present invention, describing structure, operation, and effects thereof.

The embodiment and modifications used in the following description are examples used to illustrate structure, operation, and effects pertaining to an aspect of the present invention in a way that is easy to understand, and aside from features considered essential to the present invention, the present invention is not limited to the following embodiment and modifications.

EMBODIMENT

[1. Schematic Configuration of Organic EL Display Apparatus 1]

Figure 2:
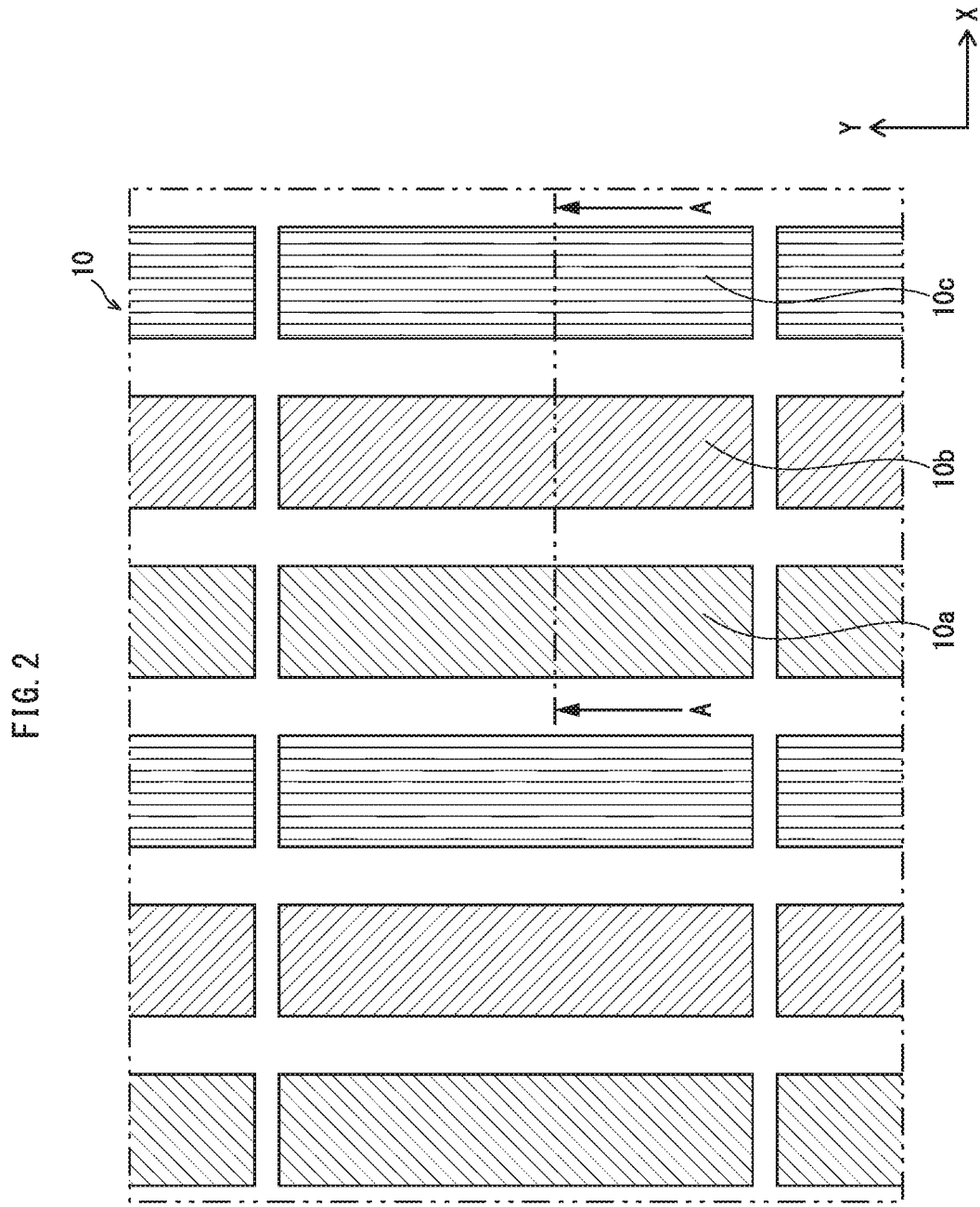
FIG. 2 is a schematic plan view showing an arrangement of sub-pixels in a display panel pertaining to an embodiment of the present invention.

The following describes a schematic configuration of a display apparatus pertaining to an embodiment of an aspect of the present invention, with reference to FIG. 1 and FIG. 2.

As shown in FIG. 1, an organic EL display apparatus 1 includes a display panel 10 and drive/control circuitry 20 connected thereto. The display panel 10 is an organic EL panel that uses electroluminescence of organic material and has a plurality of pixels.

As shown in FIG. 2, each pixel includes a sub-pixel 10a, which is an emitter of red (R) light, a sub-pixel 10b, which is an emitter of green (G) light, and a sub-pixel 10c, which is an emitter of blue (B) light. According to the present embodiment, the sub-pixels 10a, 10b, 10c are arranged in a matrix in X-Y axis directions (a two-dimensional arrangement).

Returning to FIG. 1, the drive/control circuitry 20 includes four drive circuits 21, 22, 23, 24 and a control circuit 25.

The arrangement of the display panel 10 and the drive/control circuitry 20 in the organic EL display apparatus 1 is not limited to that shown in FIG. 1.

Further, configuration of pixels in the display panel 10 is not limited to three colors R, G, B of sub-pixels (emitters) as shown in FIG. 2, and one pixel may be configured from four or more emitters.

[2. Configuration of Display Panel 10]

Figure 3:
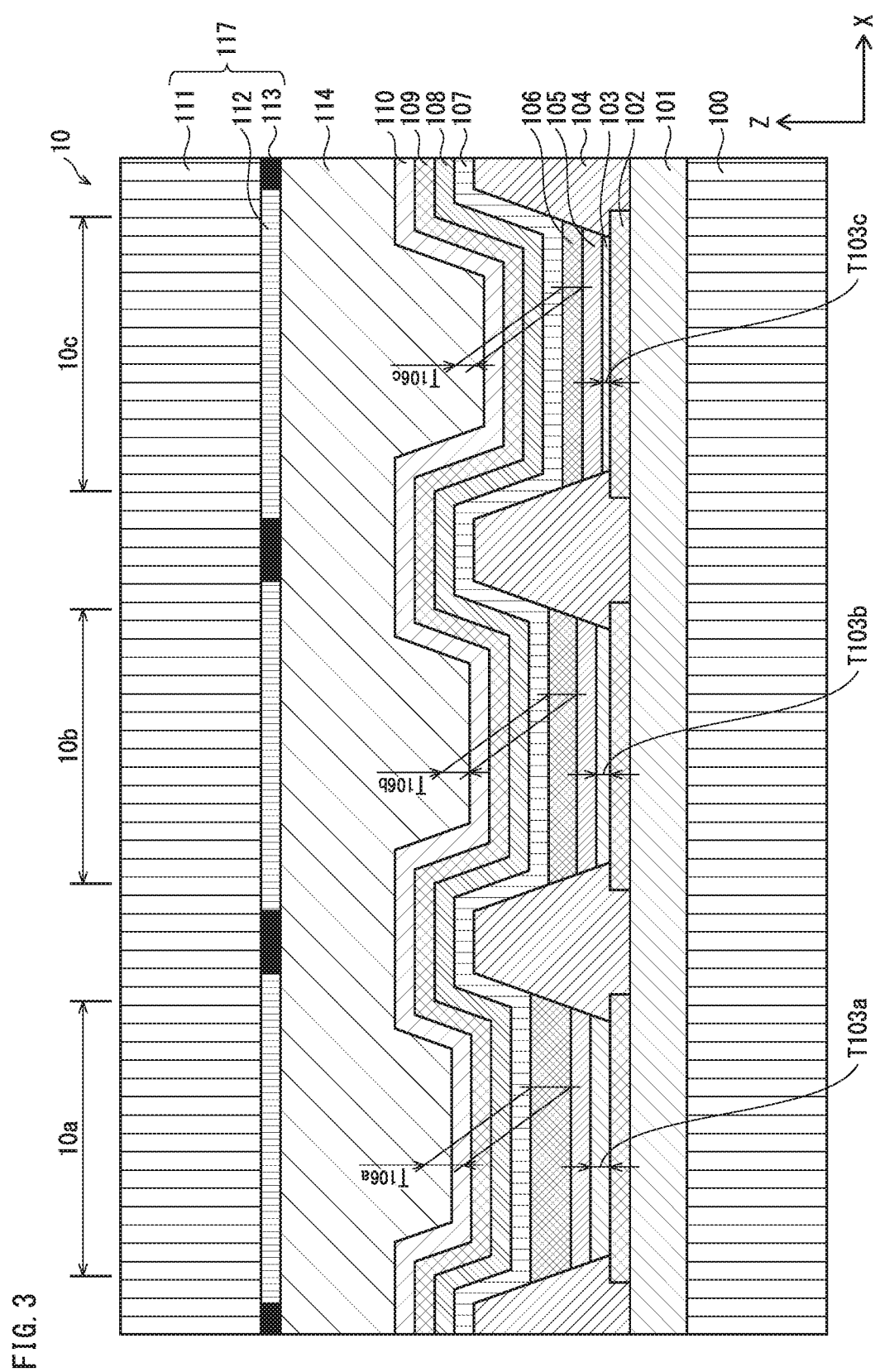
FIG. 3 is a schematic cross-section view showing a cross-section through A-A in FIG. 2.

The following describes configuration of the display panel 10, with reference to FIG. 3. As an example, the display panel 10 pertaining to the present embodiment is a top-emission type of organic EL panel. FIG. 3 is a cross-section through A-A in FIG. 2.

As shown in FIG. 3, the display panel 10 includes a TFT substrate 100 (substrate) as a base and an insulating layer 101 layered on a top surface of the TFT substrate 100. A top surface of the insulating layer 101 in a Z-axis direction is substantially flat. In FIG. 3 and elsewhere, the drawing is simplified and a thin film transistor (TFT) layer in the TFT substrate 100 is not illustrated.

An anode 102 and a hole injection layer 103 are layered in this order on the top surface of the insulating layer 101 in the Z-axis direction. The anode 102 and the hole injection layer 103 are provided for each of the sub-pixels 10a, 10b, 10c. However, the hole injection layer 103 may be continuous between the sub-pixels 10a, 10b, 10c.

First banks 104 are formed on the insulating layer 101 and covering X-axis direction ends of the hole injection layer 103. The first banks 104 are between adjacent ones of the sub-pixels 10a, 10b, 10c in the X-axis direction, and define openings that correspond to light-emitting regions in the X-axis direction.

In an opening defined by and between adjacent ones of the first banks 104, a hole transport layer 105 and an organic light-emitting layer 106 are layered in this order in the Z-axis direction.

An intermediate layer 107, an electron transport layer 108, a cathode 109, and a sealing layer 110 are layered in this order, covering a top surface of the organic light-emitting layer 106 and top surfaces of the first banks 104.

A resin layer 114 is layered on the sealing layer 110 in the Z-axis direction. A CF panel 117 is attached to the resin layer 114, the CF panel 117 including a CF panel substrate 111 and a color filter layer 112 and a black matrix layer 113 on a bottom surface of the CF panel substrate 111 in the Z-axis direction. The resin layer 114 is in close contact with the sealing layer 110, the color filter layer 112, and the black matrix layer 113.

According to the present embodiment, the TFT substrate 100 is a substrate, the anode 102 is a first electrode, and the cathode 109 is a second electrode. The hole injection layer 103 is a first charge injection/transport layer and the electron transport layer 108 is a second charge injection/transport layer.

[3. Disposition of Banks 104, 115]

Figure 4A:
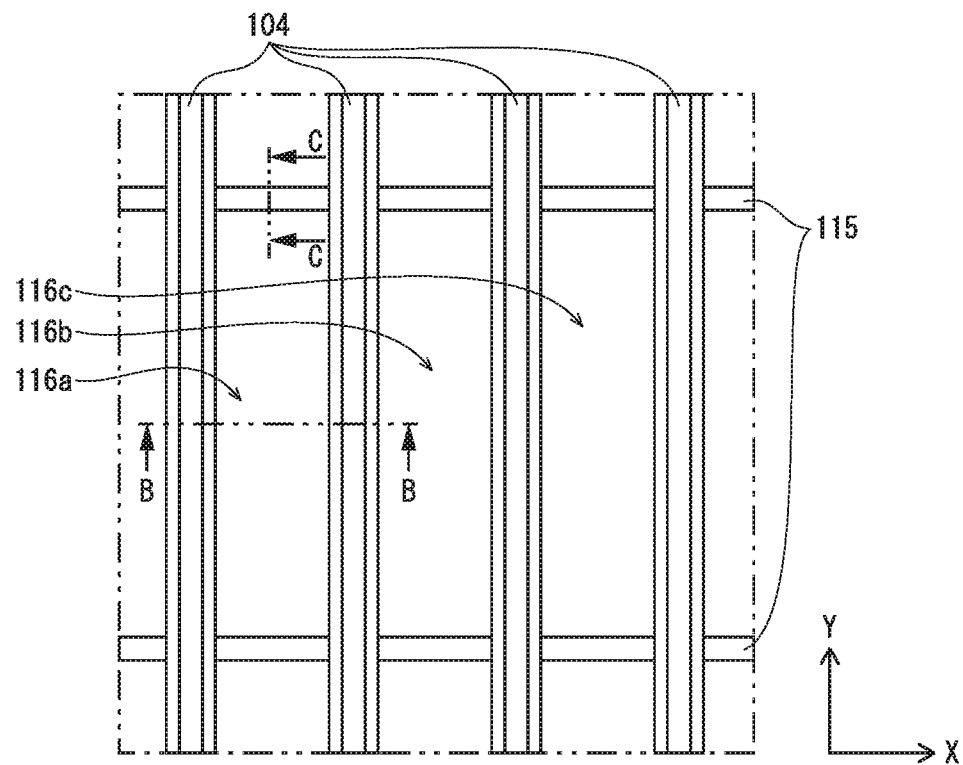
FIG. 4A is a schematic plan view showing an arrangement of banks in the display panel of FIG. 2.
Figure 4B:
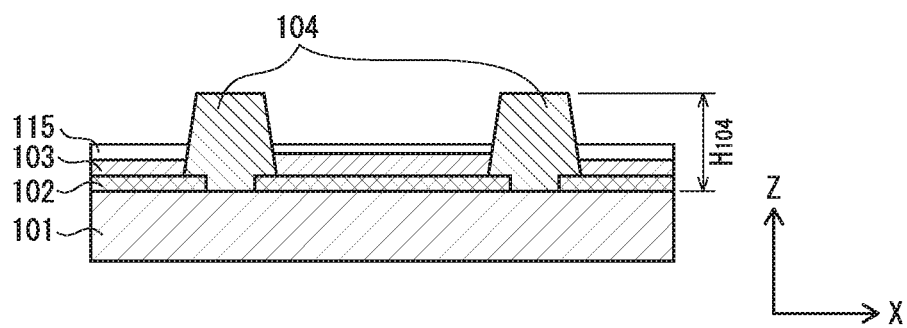
FIG. 4B is a schematic cross-section view showing a cross-section through B-B in FIG. 4A.
Figure 4C:
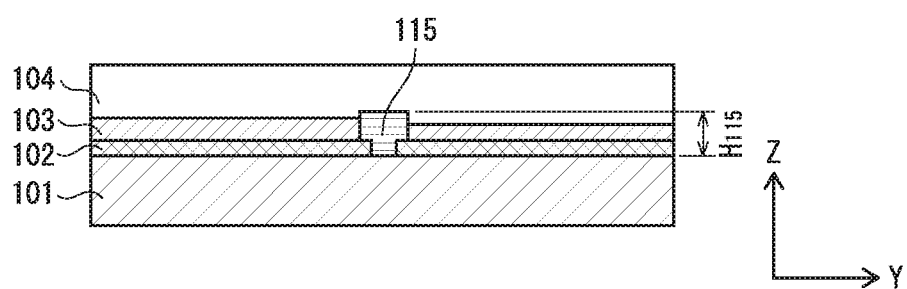
FIG. 4C is a schematic cross-section view showing a cross-section through C-C in FIG. 4A.

The following describes disposition of banks 104, 115 in the display panel 10, with reference to FIG. 4A, FIG. 4B, and FIG. 4C.

As shown in FIG. 4A, according to the display panel 10 pertaining to the present embodiment, the first banks 104 are each elongated in the Y-axis direction and disposed with intervals therebetween in the X-axis direction, and second banks 115 are each elongated in the X-axis direction and disposed with intervals therebetween in the Y-axis direction. In other words, a "line bank" structure is used in the present embodiment.

Regions defined by pairs of adjacent ones of the first banks 104 and pairs of adjacent ones of the second banks 115 are sub-pixel regions 116a, 116b, 116c. Each functional layer such as an organic light-emitting layer and hole transport layer corresponding to a light-emission color of a sub-pixel is formed in the sub-pixel regions 116a, 116b, 116c to form the sub-pixels 10a, 10b, 10c.

As shown in FIG. 4A and FIG. 4B, the first banks 104 are disposed between the sub-pixels 10a, 10b, 10c in the X-axis direction and have a height H104 measured from the top surface of the insulating layer 101.

As shown in FIG. 4A and FIG. 4C, the second banks 115 are disposed between adjacent ones of the anode 102 in the Y-axis direction. A height H115 of the second banks 115 is measured from the top surface of the insulating layer 101. Here, the height H115 of the second banks 115 is in a range from 40% to 70% of the height H104 of the first banks 104, and more specifically in a range from 50% to 55%.

[4. Material of Display Panel 10]

(1) TFT Substrate 100

The TFT substrate 100 comprises a substrate and a TFT layer on the top surface of the substrate in the Z-axis direction. The TFT layer is not illustrated, but includes three electrodes: a gate, a source, and a drain, a semiconductor layer, and a passivation film.

The substrate that is a base of the TFT substrate 100 is formed by using a glass substrate, a silica glass substrate, or a silicon substrate; or a metal substrate such as molybdenum sulfide, copper, zinc, aluminium, stainless steel, magnesium, iron, nickel, gold, or silver; or a semiconductor substrate such as a gallium arsenide; or a plastic substrate.

As a plastic substrate, a resin that is thermoplastic or thermosetting may be used. For example, polyolefin such as polyethylene, polypropylene, ethylene-propylene copolymer, ethylene-vinyl acetate copolymer (EVA), cyclic polyolefin, modified polyolefin, polyvinyl chloride, polyvinylidene chloride, polystyrene, polyamide, polyimide (PI), polyamide-imide, polycarbonate, poly-(4-methyl-1-pentene), ionomer, acrylic resin, polymethyl methacrylate, styrene acrylonitrile copolymer (SAN), butadiene styrene copolymer, ethylene vinyl alcohol (EVOH), polyethylene terephthalate (PET), polybutylene terephthalate, polyethylene naphthalate (PEN), polyester such as polycyclohexylenedimethylene terephthalate (PCT), polyether, polyether ketone, polyether sulfone (PES), polyetherimide, polyacetal, polyphenylene oxide, modified polyphenylene oxide, polyarylate, aromatic polyester (liquid crystal polymer), polytetrafluoroethylene, polyvinylidene fluoride, other fluorine-based resins, various thermoplastic elastomers such as styrene-, polyolefin-, polyvinylidene chloride-, polyurethane-, fluorine rubber-, or chlorinated polyethylene-based thermoplastic elastomers, epoxy resin, phenol resin, urea resin, melamine resin, unsaturated polyester, silicone resin, polyurethane, or a copolymer, blend, polymer alloy, etc., primarily consisting of one of the above, or a layered body including layers of one or more of the above can be used.

(2) Insulating Layer 101

The insulating layer 101 is formed by using an organic compound such as polyimide, polyamide, or acrylic resin material. Here, the insulating layer 101 preferably has organic solvent resistance.

Further, during manufacture, etching and baking processes are performed, and therefore the insulating layer 101 is preferably formed by using a material that has a high resistance to and is not deformed or deteriorated by such processes.

(3) Anode 102

The anode 102 is a metal material including silver (Ag) or aluminium (Al). In the case of the display panel 10 pertaining to the present embodiment, which is a top-emission type, surfaces of the anode 102 are preferably highly light-reflective.

The anode 102 need not be single layer structure formed from a metal material as described above, and may comprise a metal layer and a light-transmissive electrically-conductive layer. As a light-transmissive electrically-conductive material, indium tin oxide (ITO) or indium zinc oxide (IZO) may be used, for example.

(4) Hole Injection Layer 103

The hole injection layer 103 is a layer formed from an oxide of materials such as silver (Ag), molybdenum (Mo), chromium (Cr), vanadium (V), tungsten (W), nickel (Ni), or iridium (Ir), or an electrically-conductive organic material such as poly(3,4-ethylenedioxythiophene) polystyrene sulfonate (PEDOT:PSS) or Plexcore (registered trademark) of Plextronics Inc.

According to the present embodiment, the hole injection layer 103 is formed from an electrically-conductive organic material such as PEDOT:PSS.

(5) First Banks 104

The first banks 104 are formed from an organic material such as a resin and have insulating properties. As an example of an organic material used in forming the first banks 104, acrylic resin, polyimide resin, or novalac-type phenolic resin may be used. Surfaces of the first banks 104 may be fluorine treated to impart liquid repellency.

Further, structure of the first banks 104 is not limited to the single-layer structure shown in FIG. 3 and FIG. 4B, and may be a multi-layered structure having two or more layers. In such a case, each layer may be a combination of the materials above, or each layer may be an inorganic material or an organic material.

(6) Second Banks 115

The second banks 115 are formed from an inorganic insulating material or an organic insulating material. As an inorganic insulating material, silicon oxide (SiO2), silicon nitride (SiN), or silicon oxynitride (SiON) may be used. As an organic insulating material, acrylic resin, polyimide resin, siloxane resin, or phenolic resin may be used.

(7) Hole Transport Layer 105

The hole transport layer 105 is formed from an organic material that has high hole mobility, in order to efficiently transport holes from the hole injection layer 103 to the organic light-emitting layer 106. For example, a macromolecular compound that has no hydrophilic group may be used, such as polyfluorene, a derivative thereof, polyarylamine, or a derivative thereof.

(8) Organic Light-Emitting Layer 106

The organic light-emitting layer 106 has a function of emitting light generated by an excited state caused by recombination of holes and electrons injected thereto. As a material used in forming the organic light-emitting layer 106, a light-emitting organic material that can form a thin film by use of a wet printing method is preferable.

For example, as disclosed in JP H5-163488, a phosphorescent material is preferably used, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, rare earth complex, or similar.

(9) Intermediate Layer 107

The intermediate layer 107 is formed from a fluoride of an alkali metal or a fluoride of an alkaline earth metal. As a fluoride of an alkali metal or a fluoride of an alkaline earth metal used in the intermediate layer 107, specific examples include sodium fluoride (NaF), lithium fluoride (LiF), cesium fluoride (CsF), calcium fluoride (CaF2), and magnesium fluoride (MgF2). According to the present embodiment, the intermediate layer 107 is formed by using NaF.

(10) Electron Transport Layer 108

The electron transport layer 108 has a function of transporting electrons injected from the cathode 109 to the organic light-emitting layer 106, and is, for example, formed from an organic material doped with an alkali metal or alkaline earth metal. According to the present embodiment, the electron transport layer 108 is a π electron system low-molecular organic material such as an oxydiazole derivative (OXD), a triazole derivative (TAZ), or a phenanthroline derivative (BCP, Bphen), doped with barium (Ba).

As a dopant metal other than Ba, a low work function metal such as lithium (Li), calcium (Ca), cesium (Ce), sodium (Na), or rubidium (Rb); a low work function metal salt such as a lithium fluoride; a low work function metal oxide such as barium oxide; or a low work function metal organic complex such as lithium quinolinol may be used.

Concentration of the dopant metal is preferably in a range from 5 wt % to 40 wt %, for example.

(11) Cathode 109

The cathode 109 is formed by using a light-transmissive electrically-conductive film of indium tin oxide (ITO) or indium zinc oxide (IZO); or by using a metal thin film that includes aluminium (Al) or silver (Ag). As in the present embodiment, in the case of the display panel 10 that is a top-emission type, the cathode 109 is necessarily formed by using a light-transmissive material. Light transmission of the cathode 109 is preferably 80% or greater.

(12) Sealing Layer 110

The sealing layer 110 has a function of suppressing exposure of organic layers such as the organic light-emitting layer 106 to moisture and air, and may be formed from a material such as silicon oxide (SiO), silicon nitride (SiN) or silicon oxynitride (SiON). Further, a sealing resin layer formed from a resin material such as acrylic resin or silicone resin may be provided on a layer formed from one of these materials.

The sealing layer 110, in the case of the display panel 10 pertaining to the present embodiment, which is a top-emission type, is necessarily formed from a light-transmissive material.

(13) CF Panel Substrate 111

The CF panel substrate 111, like the TFT substrate 100, is formed by using a glass substrate, silica glass substrate, silicon substrate, or plastic substrate. In the case of a plastic substrate being used for the CF panel substrate 111, a thermoplastic resin or thermosetting resin may be used.

(14) Color Filter Layer 112

The color filter layer 112 selectively transmits visible light wavelengths in red (R), green (G), and blue (B) colors, and is made of a publicly-known material. The color filter layer 112 is formed based on an acrylic resin, for example.

(15) Black Matrix Layer 113

The black matrix layer 113 is formed from an ultraviolet light curable resin material that includes black pigment that has excellent light absorption and light shielding properties, for example. As a specific example of an ultraviolet light curable resin material, acrylic resin may be used.

(16) Resin Layer 114

The resin layer 114 is formed from a light-transmissive resin material (for example, an epoxy resin material). However, as a material of the resin layer 114, silicone resin may be used.

[5. Film Thickness, Light Emission Efficiency, and Drive Voltage of Organic Light-Emitting Layer 106 and Hole Injection Layer 103]

Among the colors RGB, typically B has the lowest light emission efficiency. Conventionally, an electron transport layer is typically provided as a common layer to R, G, and B light emitters, and typically material and film thickness are selected and designed so light emission efficiency of the B light emitters is maximized. However, in this case, light emission efficiency of B light emitters is maximized, but carrier balance of R and G light emitters is not always optimized and in many cases optimal light emission efficiency cannot be obtained. Thus, for R light emitters and G light emitters, a conventional method of compensating for a decrease in light emission efficiency due to a carrier balance collapse is adjusting optical cavities to improve light emission efficiency.

Here, wavelengths of R, G, and B light (primary colors) are 700 nm, 546.1 nm, and 435.8 nm, respectively. Film thickness of each type of functional layer of an organic light-emitting device is typically in a range from several nanometers to several tens of nanometers, and therefore adjusting film thickness of a functional layer to be thinner is difficult when adjusting optical cavities. Thus, a method of adjusting an optical cavity by making a film thickness of a functional layer thicker is typically used.

Organic light-emitting layers use materials corresponding to each of R, G, and B light-emission colors, and are formed for each light-emission color, and therefore film thickness can easily be changed for each of R, G, and B. Accordingly, optical cavity adjustment is easily performed by changing film thickness of an organic light-emitting layer.

However, in this case, electrical resistivity of an organic light-emitting layer is greater than that of a charge transport layer, and therefore making film thickness of the organic light-emitting layer thicker in order to adjust an optical cavity leads to a problem of a relatively large increase in drive voltage. In contrast, it may be considered that if cavity adjustment is performed by changing film thickness of a hole injection layer, which has a lower electrical resistivity than an organic light-emitting layer, an increase in drive voltage could be suppressed while improving light emission efficiency.

Thus, the inventors performed experiments to investigate changes in drive voltage and light emission efficiency when film thickness of the hole injection layer 103 is increased instead of film thickness of the organic light-emitting layer 106 being increased.

In the experiments, for two types of light emitter (light emission color R) that have different film thicknesses for the hole injection layer 103, four samples were prepared each having a different film thickness for the organic light-emitting layer 106, and light emission efficiency and drive voltages were measured for each sample. For each of the samples subjected to testing, film thickness of the hole injection layer 103 was 5 nm or 25 nm, and film thickness of the organic light-emitting layer 106 was 90 nm, 100 nm, 110 nm, or 120 nm.

Figure 5:
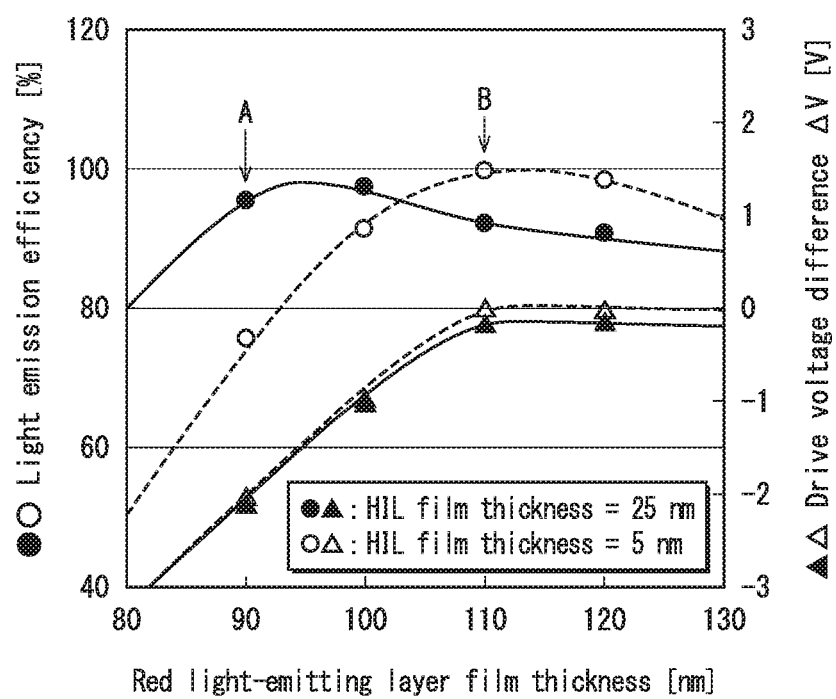
FIG. 5 shows a relationship between thicknesses of hole injection layers and organic light-emitting layers, light emission efficiency, and drive voltage.

Measured results are plotted on the graph in FIG. 5. In the graph shown in FIG. 5, the horizontal axis indicates film thickness in nanometers of the organic light-emitting layer 106, the left vertical axis indicates light emission efficiency, and the right vertical axis indicates drive voltage. Light emission efficiency of samples for which film thickness of the hole injection layer 103 was 25 nm is indicated by ● (filled black circles). Drive voltage of samples for which film thickness of the hole injection layer 103 was 25 nm is indicated by ▲ (filled black triangles). Light emission efficiency of samples for which film thickness of the hole injection layer 103 was 5 nm is indicated by ○ (unfilled circles). Drive voltage of samples for which film thickness of the hole injection layer 103 was 5 nm is indicated by ∆ (unfilled triangles). Solid curved lines indicate approximate curves of light emission efficiency and drive voltage of samples for which film thickness of the hole injection layer 103 was 25 nm. Dashed curved lines indicate approximate curves of light emission efficiency and drive voltage of samples for which film thickness of the hole injection layer 103 was 5 nm. Here, light emission efficiency is expressed as a proportion of a reference light emission efficiency obtained when film thickness of the hole injection layer 103 was 5 nm and film thickness of the organic light-emitting layer 106 was 110 nm; and drive voltage is expressed as a difference from a drive voltage obtained when film thickness of the hole injection layer 103 was 5 nm and film thickness of the organic light-emitting layer 106 was 110 nm.

As shown in FIG. 5, for samples for which film thickness of the hole injection layer 103 was 5 nm and for samples for which film thickness of the hole injection layer 103 was 25 nm, substantially the same drive voltage was indicated for the same values of film thickness of the organic light-emitting layer 106. Further, in a range of film thickness of the organic light-emitting layer 106 from 80 nm to 110 nm, drive voltage increases as film thickness increases, and samples that had a film thickness of 110 nm and 120 nm had substantially the same drive voltage. According to the above results, film thickness of the hole injection layer 103 has little effect on drive voltage and film thickness of the organic light-emitting layer 106 has a greater effect on drive voltage.

With respect to light emission efficiency, samples for which film thickness of the hole injection layer 103 was 5 nm exhibited an increase in light emission efficiency as film thickness of the organic light-emitting layer 106 increased in a range from 90 nm to 110 nm and a slight decrease in light emission efficiency from a film thickness of 110 nm to 120 nm. Samples for which film thickness of the hole injection layer 103 was 25 nm exhibited a higher light emission efficiency when film thickness of the organic light-emitting layer 106 was 100 nm than when film thickness of the organic light-emitting layer 106 was 90 nm, and a lower light emission efficiency at 110 nm than at 90 nm. Finally, the sample for which film thickness of the organic light-emitting layer 106 was 120 nm exhibited a slightly lower light emission efficiency than the sample for which film thickness of the organic light-emitting layer 106 was 110 nm. However, overall, differences in light emission efficiency due to differences in film thickness of the organic light-emitting layer 106 were relatively small when film thickness of the hole injection layer 103 was 25 nm.

Here, in the graph shown in FIG. 5, we compare the sample for which film thickness of the hole injection layer 103 was 25 nm and film thickness of the organic light-emitting layer 106 was 90 nm (sample A) with the sample for which film thickness of the hole injection layer 103 was 5 nm and film thickness of the organic light-emitting layer 106 was 110 nm (sample B). The sample A had a film thickness of the hole injection layer 103 that was 20 nm thicker and a film thickness of the organic light-emitting layer 106 that was 20 nm thinner than the sample B. Thus, the sample B had a film thickness of the hole injection layer 103 that was 20 nm thinner and a film thickness of the organic light-emitting layer 106 that was 20 nm thicker than the sample A. In other words, instead of the increase in film thickness of the organic light-emitting layer 106 of the sample B, film thickness of the hole injection layer 103 of the sample A is increased by a corresponding amount. Comparing sample A and sample B, light emission efficiency of sample A is approximately 5% lower than that of sample B, but drive voltage is over 2 V lower. The graph in FIG. 5 indicates that the sample A can obtain a much lower drive voltage than the sample B at approximately the same light emission efficiency. In other words, when increasing cavity length by 20 nm in order to perform a cavity adjustment, increasing film thickness of the hole injection layer 103 by 20 nm instead of increasing film thickness of the organic light-emitting layer 106 by 20 nm suppresses an increase in drive voltage while achieving excellent light emission efficiency.

According to the above results, altering film thickness of the hole injection layer 103 instead of the organic light-emitting layer 106 to adjust an optical cavity suppresses an increase in drive voltage while achieving excellent light emission efficiency.

In the case of conventional methods that do not focus on a difference in electrical resistivity between an organic light-emitting layer and a hole injection layer, the hole injection layer is typically formed in a single process common to each color, R, G, and B, of sub-pixels. Accordingly, in the case of conventional methods, film thickness of the hole injection layer is the same in each color, R, G, and B, of sub-pixels.

Here, returning to FIG. 3, according to the display panel 10 pertaining to the present embodiment, film thicknesses of the hole injection layer 103 are different, depending on light-emission color. According to the display panel 10, film thickness of the hole injection layer 103 in the sub-pixel 10a is T103a, film thickness of the hole injection layer 103 in the sub-pixel 10b is T103b, film thickness of the hole injection layer 103 in the sub-pixel 10c is T103c, and T103c<T103b<T103a. However, this is just an example. Film thickness of the hole injection layer 103 can be set to the most appropriate film thickness for the optical cavity of a sub-pixel, for each light-emission color.

Further, as shown in FIG. 3, film thickness of the organic light-emitting layer 106 can be different, depending on light-emission color. According to the present embodiment, as one example, film thickness of the organic light-emitting layer 106 in the sub-pixel 10a is T106a, film thickness of the organic light-emitting layer 106 in the sub-pixel 10b is T106b, film thickness of the organic light-emitting layer 106 in the sub-pixel 10c is T106c, and T106c<T106b<T106a. However, this is just an example. A film thickness that results in an excellent light-emitting property may vary according to material used in each color of the organic light-emitting layer 106.

[6. Embodiment Summary]

According to the display panel 10, which is an organic light-emitting device pertaining to the present embodiment, film thicknesses of the hole injection layer 103 are different, based on wavelengths of light-emission colors of sub-pixels. That is, for each light-emission color, film thickness of the hole injection layer 103 is set to align phases of directly-emitted light that is directly emitted externally (without being reflected) from the organic light-emitting layer 106 and reflected-emitted light that is emitted externally after being reflected at a surface of the anode 102. Accordingly, when light-emission colors are different, film thicknesses of the hole injection layer 103 are different.

More specifically, for example, as shown in FIG. 3, when the sub-pixel 10a, which is a light emitter that emits R light, is a first light emitter and the sub-pixel 10c, which is a light emitter that emits B light, is a second light emitter, the film thickness T103a of the hole injection layer 103 of the first light emitter is different from the film thickness T103c of the hole injection layer 103 of the second light emitter. More specifically, the film thickness T103a is set to be greater than the film thickness T103c. Wavelength of red (R) light is longer than wavelength of blue (B) light, and therefore in order to obtain a resonance effect of aligning phases of directly-emitted light and reflected-emitted light of R light, a longer adjusted distance is usually required for R light.

However, cavity adjustment is performed based on total film thickness of every functional layer (including the organic light-emitting layer 106) disposed between the anode 102 and the cathode 109, and therefore, for example, according to film thickness of the organic light-emitting layer 106, the film thickness T103a of the hole injection layer 103 is not necessarily always greater than the film thickness T103c. Further, optical path length adjustment changes depending on what order of reflected-emitted light is being considered for a resonance effect, and therefore the thickness T103a of the hole injection layer 103 is not necessarily greater than the film thickness T103c. In FIG. 3, T103c<T103b<T103a, but these film thicknesses do not necessarily satisfy this relationship and, for example, the magnitude relationship may be reversed.

Further, according to description of features of the display panel 10, which is an organic light-emitting device pertaining to the present embodiment, the sub-pixel 10a, which is a light emitter emitting R light, is the first light emitter, and the sub-pixel 10c, which is a light emitter emitting B light, is the second light emitter, but this is just an example. Light-emission colors of the first light emitter and the second light emitter may be different, and as long as the film thickness of the hole injection layer of the first light emitter and the film thickness of the hole injection layer of the second light emitter are different, the light-emission colors of the first light emitter and the second light emitter may be any combination from R, G, and B.

According to the configuration of the display panel 10, which is an organic light-emitting device pertaining to the present embodiment, film thickness of the hole injection layer 103 is defined according to an optical cavity that obtains an excellent light emission efficiency for each light-emission color. Accordingly, when compared to a case in which cavity adjustment is performed by altering film thickness of an organic light-emitting layer, an increase in drive voltage is suppressed while achieving an excellent light emission efficiency.

Further, according to the display panel 10, which is an organic light-emitting device pertaining to the present invention, the intermediate layer 107 is disposed between the organic light-emitting layer 106 and the electron transport layer 108, the intermediate layer 107 including a fluoride of an alkali metal or a fluoride of an alkaline earth metal. The intermediate layer 107 has a high impurity-blocking property, and therefore penetration of impurities from the organic light-emitting layer 106 to the electron transport layer 108 and the cathode 109 can be effectively blocked and high storage stability can be achieved. Accordingly, deterioration of the electron transport layer 108 is suppressed and a high electron injectivity can be maintained.

Note that according to the display panel 10 pertaining to the present embodiment, film thickness of the hole injection layer 103 is altered based on light emission color, thereby performing cavity adjustment, but this is just an example. Cavity adjustment may be performed by altering film thickness of the hole transport layer 105 instead of the hole injection layer 103, and cavity adjustment may be performed by altering film thicknesses of both the hole injection layer 103 and the hole transport layer 105.

<<Modifications>>

The description above is based on an embodiment of the present invention, but the present invention is of course not limited to the embodiment described above, and the following modifications may be made. In order to avoid duplication of description, elements that are the same as in the embodiment are assigned the same reference signs and are not described below.

(Modification 1)

According to the display panel 10 pertaining to the embodiment above, the electron transport layer 108 is a single-layer structure, but the electron transport layer 108 may be configured to have a plurality of layers.

Figure 6:
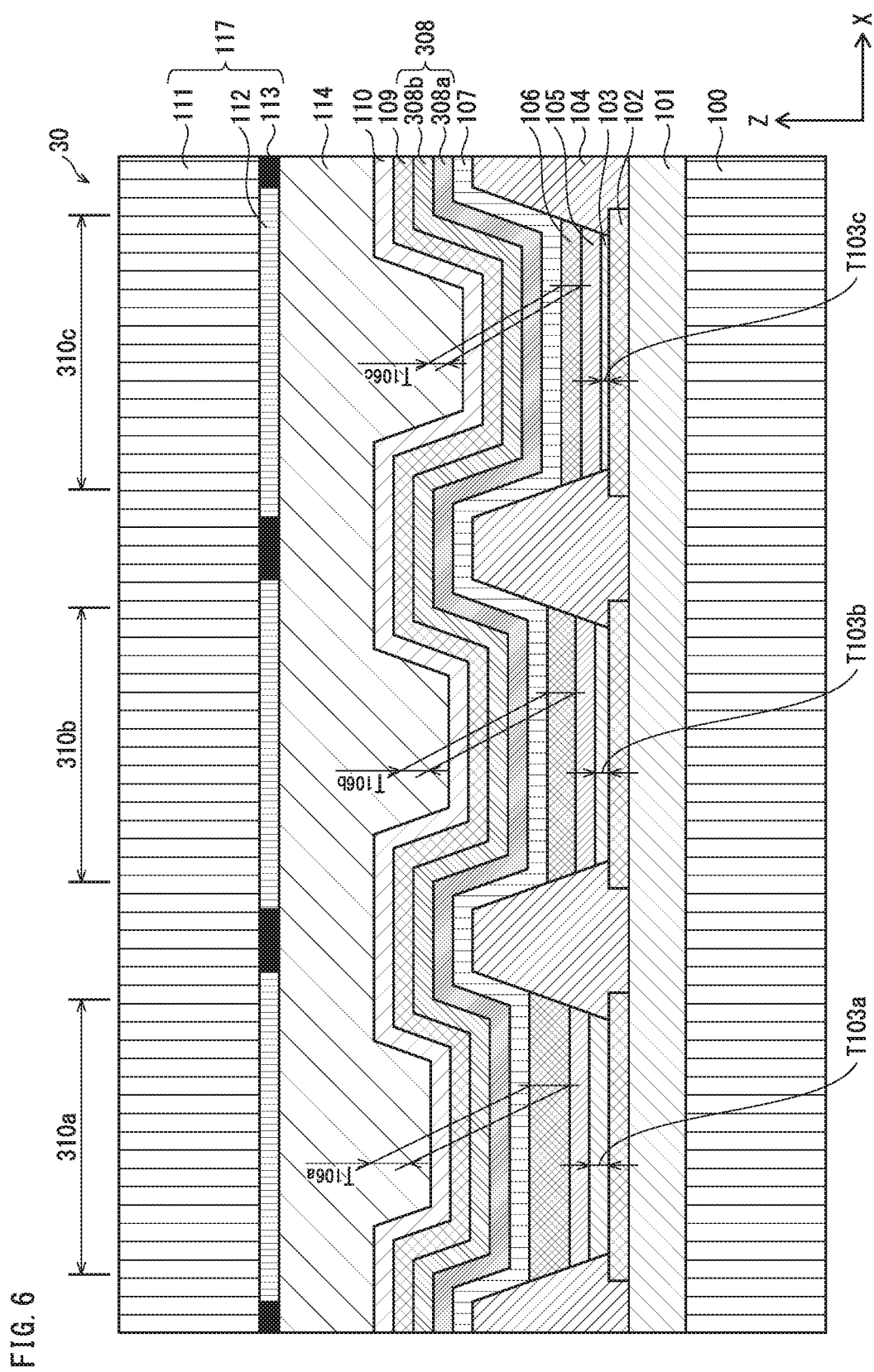
FIG. 6 is a schematic cross-section view showing a display panel pertaining to Modification 1.

A configuration of the display panel 10, which is an organic light-emitting device pertaining to Embodiment 1, is described with reference to FIG. 6. FIG. 6 is a diagram schematically showing a structure of a cross-section of a display panel 30 corresponding to an A-A cross-section in FIG. 2.

As shown in FIG. 6, in sub-pixels 310a, 310b, 310c, which are light emitters in the display panel 30 pertaining to the present modification, the organic light-emitting layer 106 is disposed between the anode 102 and the cathode 109, and the hole injection layer 103 and the hole transport layer 105 are disposed in this order from the anode 102, between the anode 102 and the organic light-emitting layer 106. The intermediate layer 107 is disposed between the cathode 109 and the organic light-emitting layer 106. The configuration described so far is the same as for the above embodiment.

The present modification also includes an electron transport layer disposed between the organic light-emitting layer 106 and the intermediate layer 107, but according to the present modification an electron transport layer 308 is a two-layer structure comprising, in order from the organic light-emitting layer 106, a first electron transport layer portion 308a (first layer) and a second electron transport layer portion 308b (second layer).

The second electron transport layer portion 308b is the same as the electron transport layer 108 in the embodiment.

Here, when the alkali metal or alkaline earth metal included in the intermediate layer 107 is a "first metal", the first electron transport layer portion 308a is a layer comprising a "second metal" that has a function of cleaving a bond between the first metal and fluorine in the fluoride of the first metal included in the intermediate layer 107. Specifically, the second metal is an alkali metal or alkaline earth metal. More specifically, for example, the second metal is barium (Ba).

The first electron transport layer portion 308a is not limited to being configured from only the second metal. Small amounts of impurities may of course be included, but it suffices that the second metal is a main component of the first electron transport layer portion 308a. Here, "main component" means that the second metal is at least 40 wt % of the first electron transport layer portion 308a.

According to the display panel 30 pertaining to the present modification that has the configuration above, the following effects can be achieved in addition to the effects of the display panel 10 pertaining to the embodiment.

The fluoride of the first metal in the intermediate layer 107, i.e., the fluoride of the alkali metal or alkaline earth metal (for example, NaF), has a high electron insulating property. Accordingly, it would seem that electron injection from the electron transport layer 308 to the organic light-emitting layer 106 would be hindered. However, according to the present modification, the first electron transport layer portion 308a of the electron transport layer 308 is disposed in contact with the intermediate layer 107, and the first electron transport layer portion 308a comprises an alkali metal or alkaline earth metal that is the second metal, and therefore a bond between the fluorine and the alkali metal or alkaline earth metal in the intermediate layer 107 (a bond between fluorine and the first metal) can be cleaved by the second metal. Thus, the alkali metal or alkaline earth metal (for example, Na) in the intermediate layer 107, which is the first metal, is released. The first metal has a high electron injectivity, and therefore electron injectivity from the electron transport layer 308 to the organic light-emitting layer 106 is kept high.

According to the present modification, film thickness of the first electron transport layer portion 308a is preferably in a range from 3% to 25% of film thickness of the intermediate layer 107. Further, film thickness of the intermediate layer 107 is from 1 nm to 10 nm, approximately, and film thickness of the first electron transport layer portion 308a is from 0.1 nm to 1 nm, approximately. An actual boundary between the intermediate layer 107 and the first electron transport layer portion 308a is not clearly defined, and material of the intermediate layer 107 and material of the first electron transport layer portion 308a may be mixed to a certain extent during manufacture. In such a case, it suffices that the film thicknesses of the intermediate layer 107 and the first electron transport layer portion 308a are formed by a method that is intended to result in values in the ranges described above.

Further, it is preferable that a dopant metal in the second electron transport layer portion 308b and the second metal in the first electron transport layer portion 308a are the same type of metal. This is due to consideration of ease of manufacture. In particular, using barium as the dopant metal and the second metal is preferable. Barium is a metal with a high general versatility and its use can reduce costs.

The present modification also suppresses an increase in drive voltage while achieving an excellent light emission efficiency, by performing of cavity adjustment by altering film thickness of the hole injection layer 103 for each light emission color.

According to the present modification, the TFT substrate 100 is a substrate, the anode 102 is a first electrode, and the cathode 109 is a second electrode. The hole injection layer 103 is a first charge injection/transport layer and the electron transport layer 308 is a second charge injection/transport layer. According to the present modification, cavity adjustment may be performed by changing film thickness of the hole transport layer 105 instead of the hole injection layer 103. In this case, the hole transport layer 105 is the first charge injection/transport layer. Further, cavity adjustment may be performed by altering film thicknesses of both the hole injection layer 103 and the hole transport layer 105, and in this case both the hole injection layer 103 and the hole transport layer 105 are the first charge injection/transport layer.

(Modification 2)

The display panel 10 pertaining to the present embodiment is a top-emission type of organic EL panel, but this is just an example. Configuration of the display panel 10 can also be applied to a bottom-emission type of organic EL panel.

According to the display panel pertaining to Modification 2, in which configuration of the display panel 10 is applied to a bottom-emission type of organic EL panel, the following points are different from the display panel 10 pertaining to the embodiment. The cathode 109 is light-reflective, and the anode 102 is a light-transmissive material. More specifically, the cathode 109 is a metal material including silver (Ag) or aluminium (Al), and the anode 102 is formed using indium tin oxide (ITO) or indium zinc oxide (IZO).

Further, according to the display panel 10 pertaining to the embodiment, the electron transport layer 108 is a continuous layer common to a plurality of sub-pixels, but in the case of the present modification, the electron transport layer 108 is formed for each sub-pixel and film thickness of the electron transport layer 108 is different for sub-pixels of different light-emission colors. In other words, film thickness of the electron transport layer 108 is defined to be most appropriate for the optical cavity of each sub-pixel, based on wavelengths of light-emission colors. Thus, an excellent light emission efficiency can be achieved. Further, the electron transport layer 108 has a lower electrical resistivity than the organic light-emitting layer 106, and therefore even if film thickness of the electron transport layer 108 is increased, an increase in drive voltage is suppressed, relative to a case in which cavity adjustment is performed by increasing film thickness of an organic light-emitting layer. Accordingly, increase in drive voltage is suppressed while achieving an excellent light emission efficiency.

According to the bottom-emission type of display panel pertaining to the present modification, the electron transport layer 108 has a lower electrical resistivity than the organic light-emitting layer 106, and therefore performing cavity adjustment via film thickness of the electron transport layer 108 has the same effects as in the display panel 10, which is a top-emission type pertaining to the embodiment, of suppressing an increase in drive voltage while achieving an excellent light emission efficiency.

According to the present modification, optical cavity adjustment is performed via film thickness of the electron transport layer 108, and therefore film thickness of the hole injection layer 103 may be the same for each sub-pixel.

According to the present modification, the TFT substrate 100 is a substrate, the anode 102 is a first electrode, and the cathode 109 is a second electrode. Further, the hole injection layer 103 is a first charge injection/transport layer and the electron transport layer 108 is a second charge injection/transport layer.

(Modification 3)

According to the display panel 10 pertaining to the embodiment, the anode 102 is disposed at the TFT substrate 100 side and the cathode 109 is disposed at the CF panel 117 side, but this is just an example. For example, the structure in the Z-axis direction may be such that the positional relationship of the anode 102 and the cathode 109 is reversed.

Figure 7:
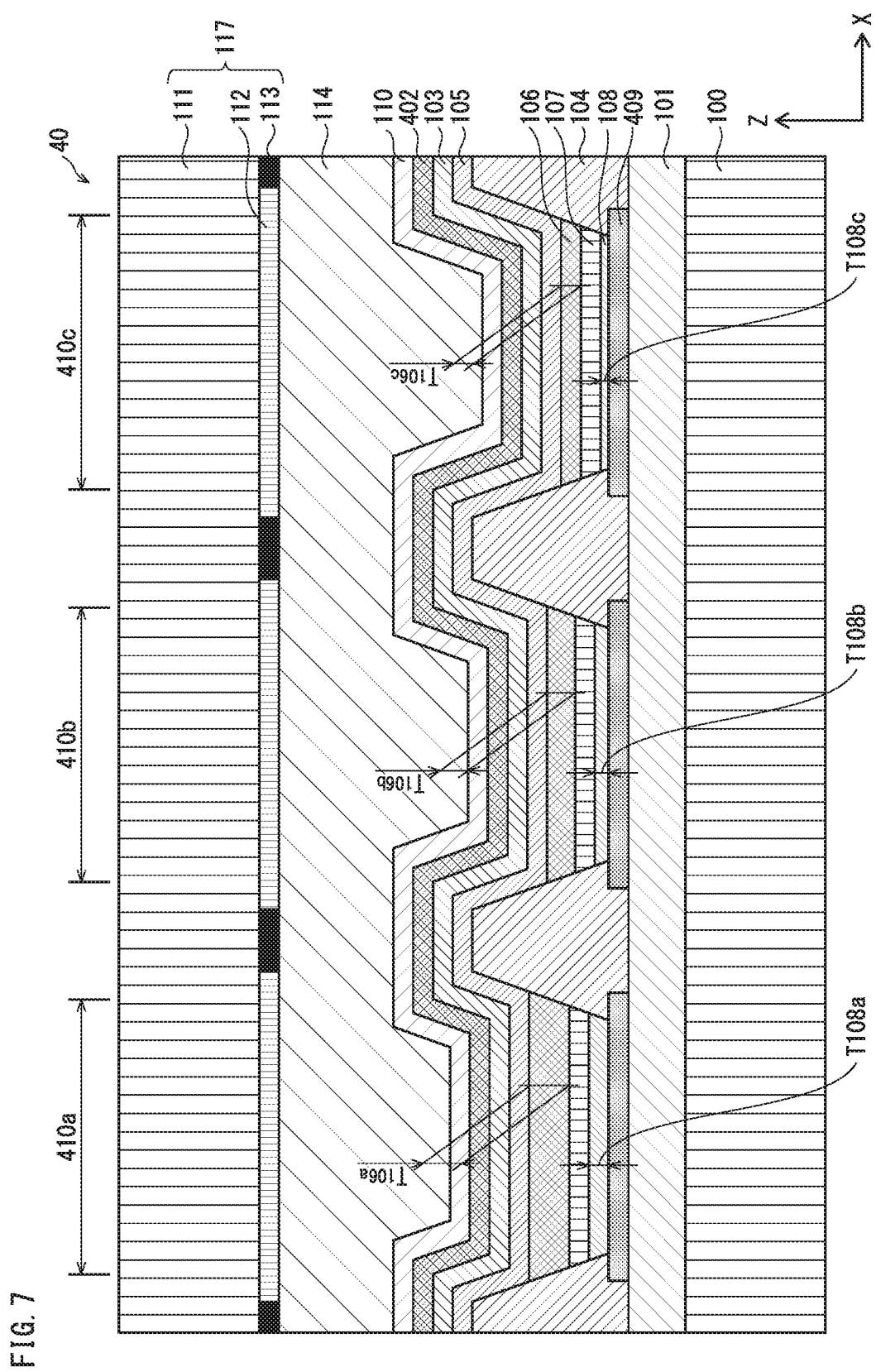
FIG. 7 is a schematic cross-section view showing a display panel pertaining to Modification 3.

A configuration of a display panel 40, which is an organic light-emitting device pertaining to the present modification, is described with reference to FIG. 7. FIG. 7 is a diagram schematically showing a structure of a cross-section of a display panel 40 corresponding to an A-A cross-section in FIG. 2. According to the present modification, the display panel 40 is a top-emission type of display panel.

As shown in FIG. 7, in sub-pixels 410a, 410b, 410c, which are light-emitters in the display panel 40 pertaining to the present modification, a cathode 409 is disposed at the TFT substrate 100 side and an anode 402 is disposed at the CF panel 117 side. Between the cathode 409 and the anode 402, from the cathode 409 side, are disposed the electron transport layer 108, the intermediate layer 107, the organic light-emitting layer 106, the hole transport layer 105, and the hole injection layer 103.

The display panel 40 pertaining to the present modification is a top-emission type, and light is extracted from the anode 402 side, and therefore the anode 402 is necessarily formed from a light-transmissive material. The anode 402 is formed by using indium tin oxide (ITO) or indium zinc oxide (IZO), for example. Light transmission of the anode 402 is preferably 80% or greater.

The cathode 409 is a metal material including silver (Ag) or aluminium (Al). In the case of the display panel 40 pertaining to the present modification, which is a top-emission type, surfaces of the cathode 409 are preferably highly reflective.

The cathode 409 need not be single layer structure formed from a metal material as described above, and may comprise a metal layer and a light-transmissive electrically-conductive layer. As a light-transmissive electrically-conductive material, indium tin oxide (ITO) or indium zinc oxide (IZO) may be used, for example.

According to the display panel 40 pertaining to the present modification, as shown in FIG. 7, film thickness of the electron transport layer 108 is different for different light emission colors. More specifically, for example, in the case of the display panel shown in FIG. 7, film thickness of the electron transport layer 108 of the sub-pixel 410a of the R light emitter is T108a, film thickness of the electron transport layer 108 of the sub-pixel 410b of the G light emitter is T108b, film thickness of the electron transport layer 108 of the sub-pixel 410c of the B light emitter is T108c, and T108c<T108b<T108a. This is because film thickness of the electron transport layer 108 is defined as a film thickness that optimizes an optical cavity, based on a wavelength of light-emission color of a sub-pixel. Thus, film thickness of the electron transport layer 108 is different for each light-emission color, in order to perform cavity adjustment, and therefore an excellent light emission efficiency is achieved. Further, the electron transport layer 108 has a lower electrical resistivity than the organic light-emitting layer 106, and therefore even if film thickness of the electron transport layer 108 is increased, an increase in drive voltage is suppressed, relative to a case in which cavity adjustment is performed by increasing film thickness of an organic light-emitting layer. Accordingly, increase in drive voltage is suppressed while achieving an excellent light emission efficiency.

According to the present modification, a relationship of film thicknesses of the electron transport layer 108 for different sub-pixels is given as T108c<T108b<T108a, but this is just an example. Film thickness of the hole transport layer 108 can be set to the most appropriate film thickness for the optical cavity of a sub-pixel, for each light-emission color.

Further, according to the present modification, the CF panel substrate 111 is a substrate, the anode 402 is a first electrode, and the cathode 409 is a second electrode. Further, at least one of the hole injection layer 103 and the hole transport layer 105 is a first charge injection/transport layer, and the electron transport layer 108 is a second charge injection/transport layer.

(Modification 4)

The display panel 40 pertaining to Modification 3 is a top-emission type of display panel, but the configuration of Modification 3 can also be applied to a bottom-emission type of display panel.

The bottom-emission type of display panel pertaining to Modification 4 is different from the display panel 40 pertaining to Modification 3 in the following points. The anode 402 is light-reflective, and the cathode 409 is a light-transmissive material. More specifically, the anode 402 is a metal material including silver (Ag) or aluminium (Al), and the cathode 409 is formed using indium tin oxide (ITO) or indium zinc oxide (IZO).

Further, according to the display panel 40 pertaining to Modification 3, the hole injection layer 103 and the hole transport layer 105 are continuous layers common to a plurality of sub-pixels, but in the case of the present modification, at least one of the hole injection layer 103 and the hole transport layer 105 is formed for each of the sub-pixels. In sub-pixels of different light-emission colors, film thickness of at least one of the hole injection layer 103 and the hole transport layer 105 is different for each sub-pixel. That is, at least one of film thickness of the hole injection layer 103 and film thickness of the hole transport layer 105 is determined so as to optimize optical cavities of each sub-pixel, based on wavelengths of light-emission colors. Thus, an excellent light emission efficiency can be achieved. Further, the hole injection layer 103 and the hole transport layer 105 have a lower electrical resistivity than the organic light-emitting layer 106, and therefore even if film thickness of the hole injection layer 103 and/or the hole transport layer 105 is increased, an increase in drive voltage is suppressed, relative to a case in which cavity adjustment is performed by increasing film thickness of an organic light-emitting layer. Accordingly, increase in drive voltage is suppressed while achieving an excellent light emission efficiency.

In a case of both the hole injection layer 103 and the hole transport layer 105 being formed for each sub-pixel, sub-pixels for which light-emission colors are different may have different total film thicknesses for both the hole injection layer 103 and the hole transport layer 105, or different film thicknesses for the hole injection layer 103 or the hole transport layer 105.

Further, according to the present modification, the CF panel substrate 111 is a substrate, the anode 402 is a first electrode, and the cathode 409 is a second electrode. Further, at least one of the hole injection layer 103 and the hole transport layer 105 is a first charge injection/transport layer, and the electron transport layer 108 is a second charge injection/transport layer.

(Modification 5)

The first electron transport layer portion 308a of Modification 1 may be applied to the configuration of Modification 3 and to the configuration of Modification 4. In this case, the first electron transport layer portion 308a is disposed between the intermediate layer 107 and the electron transport layer 108 (corresponding to the second electron transport layer portion 308b of Modification 1). Further, different film thicknesses for each sub-pixel based on light-emission color may be formed by the first electron transport layer portion 308a, and film thickness of the first electron transport layer portion 308a may be used in cavity adjustment.

Configuration of the display panel pertaining to the present modification may be top-emission, and may be bottom-emission.

(Modification 6)

The display panel 10 pertaining to the embodiment has a line-bank structure including the first banks 104 and the second banks 115 that have a lower height than the first banks 104, but this is just an example. The first banks and the second banks may have the same height, may be formed as a single body, and may have a pixel bank structure.

In these cases, cavity adjustment is performed by altering film thickness of the hole injection layer 103 for each light-emission color, suppressing an increase in drive voltage while achieving an excellent light emission efficiency.

(Modification 7)

Aiming to increase hole injectivity, an additional thin film of a metal oxide may be disposed between the anode 102 and the hole injection layer 103. As a metal oxide, for example, tungsten oxide or molybdenum oxide may be used. In this case, the thin film of metal oxide is formed by sputtering, for example. Thus, in a case in which film thickness is altered according to light-emission color, a mask for each color and multiple iterations of sputtering are not necessary, and typically, a film thickness common to each light-emission color can be formed by a single sputtering process, as the process is complicated. Cavity length does include film thickness of such a thin film of metal oxide, but for the above reason it is easier to perform cavity adjustment by altering film thickness of the hole injection layer 103.

(Modification 8)

Figure 8:
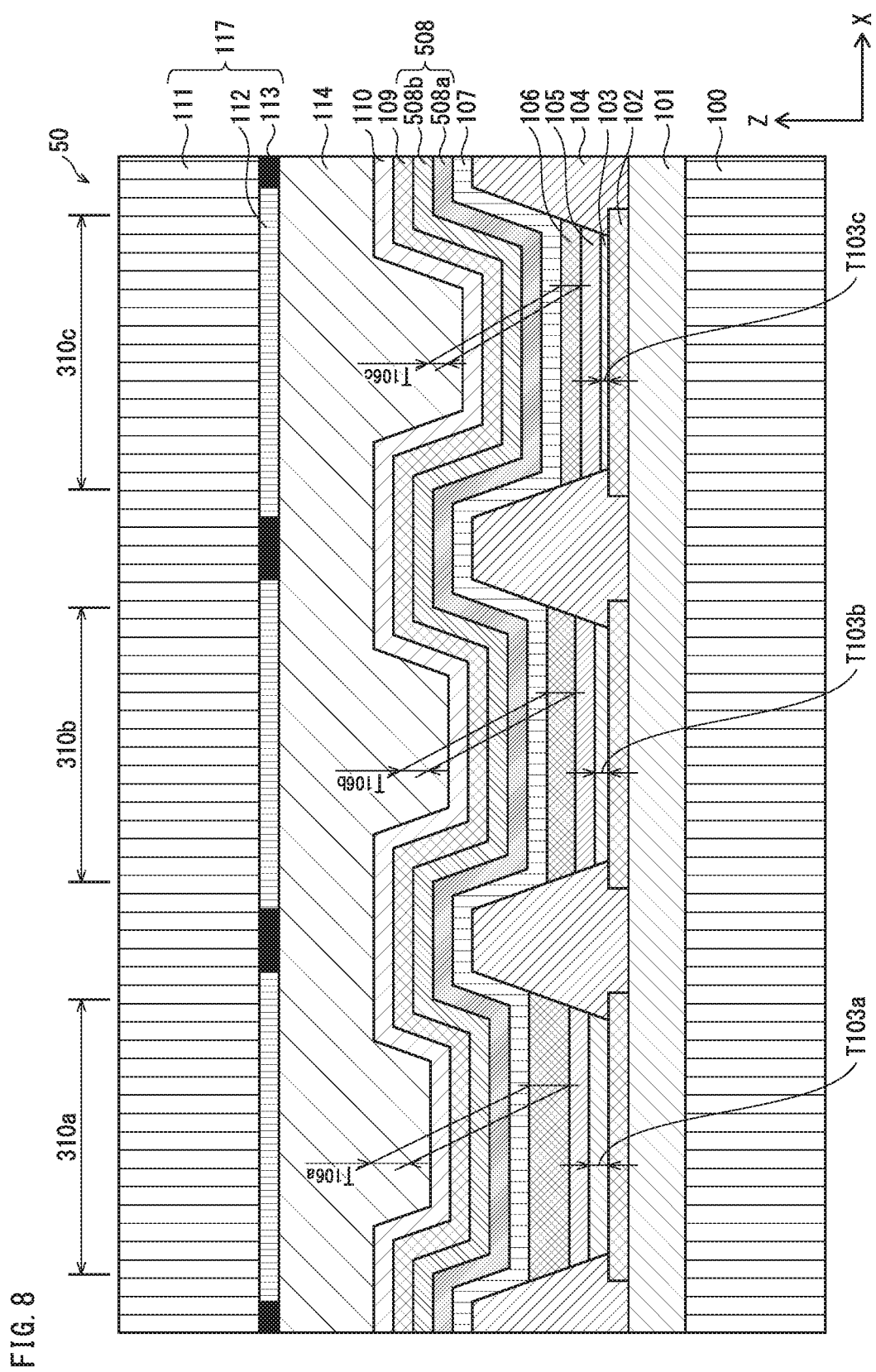
FIG. 8 is a schematic cross-section view showing a display panel pertaining to Modification 8.

According to Modification 1, the electron transport layer 308 is a two-layer structure comprising the first electron transport layer portion 308a and the second electron transport layer portion 308b, both portions including an alkali metal or alkaline earth metal. However, the second electron transport layer portion may be configured without an alkali metal or alkaline earth metal dopant. FIG. 8 shows a configuration of a display panel 50 that is an organic light-emitting device pertaining to Modification 8. FIG. 8 is a diagram schematically showing a structure of a cross-section of the display panel 50 corresponding to an A-A cross-section in FIG. 2.

According to the present modification, an electron transport layer 508 comprises a first electron transport layer portion 508a (first layer) and a second electron transport layer portion 508b (second layer). The first electron transport layer portion 508a is the same as the first electron transport layer portion 308a in Modification 1. The second electron transport layer portion 508b, aside from the point of not being doped with a metal, is the same as the electron transport layer 108 in the embodiment and the second electron transport layer portion 308b in Modification 1. That is, the second electron transport layer portion 508b is formed from an organic material that has a function of transporting electrons injected from the cathode 109 to the organic light-emitting layer 106. As the organic material, a π electron system low-molecular organic material can be used such as an oxydiazole derivative (OXD), a triazole derivative (TAZ), or a phenanthroline derivative (BCP, Bphen).

According to the configuration of the present modification, the second metal included in the first electron transport layer portion 508a cleaves a bond between the first metal and the fluorine included in the intermediate layer 107, achieving the same effect as Modification 1.

(Other Items)

The embodiment and each modification described above is applied to a display panel, which is an organic EL panel, as an example of an organic light-emitting device. However, the present invention is not limited in this way. For example, even when the configuration of the present invention is applied to organic EL lighting, the same effects can be achieved.

Further, the embodiment and each modification described above is applied to an active matrix type of display panel. However, the present invention is not limited in this way. For example, the present invention is applicable to a passive matrix type of display panel.

Further, as shown in FIG. 2, according to the embodiment, one pixel is a combination of three sub-pixels 10a, 10b, 10c that each have a rectangular shape in plan view, but the present invention is not limited in this way. For example, in plan view, each sub-pixel may be a shape such as triangular, hexagonal, or octagonal. Further, a honeycomb shape may be used. In such a case, in plan view, the first banks may have a winding crank-like shape. Further, the number of sub-pixels in one pixel may be two, or may be four or more. In such a case, a plurality of sub-pixels in one pixel may emit different colors of light from each other or may emit the same color of light as each other.

Further, in the X-axis in FIG. 2, a wiring layer (bus bar wiring) that connects cathodes may be disposed between adjacent pixels.

Further, material of the intermediate layer is not limited to NaF, and material of the first electron transport layer portion is not limited to Ba. It suffices that the intermediate layer is formed from a fluoride of an alkali metal or alkaline earth metal, and impurities may also be present.

Similarly, it suffices that the first electron transport layer portion is formed from an alkali metal or alkaline earth metal, and preferably the same as a metal dopant in the second electron transport layer portion.

The above describes an organic light-emitting device and display apparatus pertaining to the present invention based on the embodiment and modifications, but the present invention is not limited to the embodiment and modifications described above. Based on the embodiment and modifications above, configurations that would occur to a person having ordinary skill in the art, and configurations implemented by any combination of elements and functions of the embodiment and modifications above that do not depart from the scope of the present invention are included in the present invention.

INDUSTRIAL APPLICABILITY

The present invention is applicable to implementation of organic light-emitting devices and organic display apparatuses that have a high light emission efficiency.

REFERENCE SIGNS LIST

1. Organic EL display apparatus
10, 30, 40, 50. Display panel (organic light-emitting device)
10a, 10b, 10c. Sub-pixel (light emitter)
20. Drive/control circuitry
100. TFT substrate (substrate)
102. Anode (first electrode, second electrode)
103. Hole injection layer (first charge injection/transport layer, second charge injection/transport layer)
105. Hole transport layer
106. Organic light-emitting layer
107. Intermediate layer 108, 308, 508. Electron transport layer (first charge injection/transport layer, second charge injection/transport layer)
109. Cathode (first electrode, second electrode)
308a, 508a. First electron transport layer portion (first layer)
308b, 508b. Second electron transport layer portion (second layer)

The invention claimed is:
1. A light-emitting device comprising:
a plurality of light emitters arranged in two dimensions along a surface of a substrate, each light emitter of the plurality of light emitters comprising:
a first electrode disposed above the substrate;
a first charge injection/transport layer disposed above the first electrode;
a light-emitting layer disposed above the first charge injection/transport layer;
an intermediate layer disposed above the light-emitting layer;
a second charge injection/transport layer disposed on the intermediate layer;
a second electrode disposed above the second charge injection/transport layer; and
a pixel bank disposed on an insulating layer disposed on the surface of the substrate, the pixel bank being one or more banks elongated in a first dimension among the two dimensions and disposed with intervals therebetween in a second dimension among the two dimensions,
wherein
the intermediate layer includes a fluoride of an alkali metal or a fluoride of an alkaline earth metal,
among the first electrode and the second electrode, one electrode is light reflective and an other electrode is light transmissive,
the plurality of light emitters include a first light emitter that emits a first color of light and a second light emitter that emits a second color of light that is different from the first color of light,
among the first charge injection/transport layer and the second charge injection/transport layer, one charge injection/transport layer is disposed between the light-emitting layer and the light reflective electrode, and thickness of the one charge injection/transport layer included in the first light emitter is different from thickness of the one charge injection/transport layer included in the second light emitter,
the alkali metal or alkaline earth metal of the fluoride included in the intermediate layer is a first metal, and a metal included in the second charge injection/transport layer is a second metal, and
the second metal has a property of cleaving a bond between the first metal and fluorine included in the fluoride of the first metal.

2. The light-emitting device of claim 1, further comprising a line bank disposed on an insulating layer disposed on the surface of the substrate, the line bank being one or more banks elongated in the first dimension among the two dimensions and disposed with intervals therebetween in the second dimension among the two dimensions.

3. The light-emitting device of claim 1, wherein the second charge injection/transport layer includes a material doped with the second metal.

4. The light-emitting device of claim 1, wherein the first electrode is an anode,
the second electrode is a cathode,
the first charge injection/transport layer is a hole injection layer, and
the second charge injection/transport layer is an electron transport layer.

5. A light-emitting device comprising:
a plurality of light emitters arranged in two dimensions along a surface of a substrate, each light emitter of the plurality of light emitters comprising:
a first electrode disposed above the substrate;
a first charge injection/transport layer disposed above the first electrode;
a light-emitting layer disposed above the first charge injection/transport layer;
an intermediate layer disposed above the light-emitting layer;
a second charge injection/transport layer disposed on the intermediate layer; and
a second electrode disposed above the second charge injection/transport layer,
wherein
the intermediate layer includes a fluoride of an alkali metal or a fluoride of an alkaline earth metal,
among the first electrode and the second electrode, one electrode is light reflective and an other electrode is light transmissive,
the plurality of light emitters include a first light emitter that emits a first color of light and a second light emitter that emits a second color of light that is different from the first color of light,
among the first charge injection/transport layer and the second charge injection/transport layer, one charge injection/transport layer is disposed between the light-emitting layer and the light reflective electrode, and thickness of the one charge injection/transport layer included in the first light emitter is different from thickness of the one charge injection/transport layer included in the second light emitter,
the alkali metal or alkaline earth metal of the fluoride included in the intermediate layer is a first metal, and a metal included in the second charge injection/transport layer is a second metal,
the second metal has a property of cleaving a bond between the first metal and fluorine included in the fluoride of the first metal,
the second charge injection/transport layer includes a first layer made from the second metal and a second layer, and
the first layer is disposed in contact with the intermediate layer.

6. The light-emitting device of claim 5, wherein the second layer includes a material doped with the alkali metal or alkaline earth metal.

7. The light-emitting device of claim 6, wherein the alkali metal or alkaline earth metal used to dope the material in the second layer is the second metal.

8. The light-emitting device of claim 5, wherein the second layer does not include a metal dopant.

9. A light-emitting device comprising:
a plurality of light emitters arranged in two dimensions along a surface of a substrate, each light emitter of the plurality of light emitters comprising:
a first electrode disposed above the substrate;
a first charge injection/transport layer disposed above the first electrode;
a light-emitting layer disposed above the first charge injection/transport layer;

an intermediate layer disposed above the light-emitting layer;
a second charge injection/transport layer disposed on the intermediate layer; and
a second electrode disposed above the second charge injection/transport layer, wherein the intermediate layer includes a fluoride of an alkali metal or a fluoride of an alkaline earth metal, among the first electrode and the second electrode, one electrode is light reflective and an other electrode is light transmissive, the plurality of light emitters include a first light emitter that emits a first color of light and a second light emitter that emits a second color of light that is different from the first color of light, among the first charge injection/transport layer and the second charge injection/transport layer, one charge injection/transport layer is disposed between the light-emitting layer and the light reflective electrode, and thickness of the one charge injection/transport layer included in the first light emitter is different from thickness of the one charge injection/transport layer included in the second light emitter, the alkali metal or alkaline earth metal of the fluoride included in the intermediate layer is a first metal, and a metal included in the second charge injection/transport layer is a second metal, the second metal has a property of cleaving a bond between the first metal and fluorine included in the fluoride of the first metal, the first electrode is a cathode, the second electrode is an anode, the first charge injection/transport layer is an electron transport layer, and the second charge injection/transport layer is a hole injection layer.

10. The light-emitting device of claim 9, wherein
the first electrode is light reflective, and
the first charge injection/transport layer includes π-electron system material including the alkali metal or the alkaline earth metal.

11. The light-emitting device of claim 9, wherein
the second electrode is light reflective, and
the second charge injection/transport layer includes an electrically-conductive material.

12. A light-emitting device comprising:
a plurality of light emitters arranged in two dimensions along a surface of a substrate, each light emitter of the plurality of light emitters comprising:
a first electrode disposed above the substrate;
a first charge injection/transport layer disposed above the first electrode;
a light-emitting layer disposed above the first charge injection/transport layer;
an intermediate layer disposed above the light-emitting layer;
a second charge injection/transport layer disposed on the intermediate layer; and
a second electrode disposed above the second charge injection/transport layer, wherein the intermediate layer includes a fluoride of an alkali metal or a fluoride of an alkaline earth metal, among the first electrode and the second electrode, one electrode is light reflective and an other electrode is light transmissive, the plurality of light emitters include a first light emitter that emits a first color of light and a second light emitter that emits a second color of light that is different from the first color of light, among the first charge injection/transport layer and the second charge injection/transport layer, one charge injection/transport layer is disposed between the light-emitting layer and the light reflective electrode, and thickness of the one charge injection/transport layer included in the first light emitter is different from thickness of the one charge injection/transport layer included in the second light emitter, the alkali metal or alkaline earth metal of the fluoride included in the intermediate layer is a first metal, and a metal included in the second charge injection/transport layer is a second metal, the second metal has a property of cleaving a bond between the first metal and fluorine included in the fluoride of the first metal, and the intermediate layer extends to connects with both the first light emitter and the second light emitter.

13. A light-emitting device comprising:
a plurality of light emitters arranged in two dimensions along a surface of a substrate, each light emitter of the plurality of light emitters comprising:
a first electrode disposed above the substrate;
a first charge injection/transport layer disposed above the first electrode;
a light-emitting layer disposed above the first charge injection/transport layer;
an intermediate layer disposed above the light-emitting layer;
a second charge injection/transport layer disposed on the intermediate layer; and
a second electrode disposed above the second charge injection/transport layer, wherein the intermediate layer includes a fluoride of an alkali metal or a fluoride of an alkaline earth metal, among the first electrode and the second electrode, one electrode is light reflective and an other electrode is light transmissive, the plurality of light emitters include a first light emitter that emits a first color of light and a second light emitter that emits a second color of light that is different from the first color of light, among the first charge injection/transport layer and the second charge injection/transport layer, one charge injection/transport layer is disposed between the light-emitting layer and the light reflective electrode, and thickness of the one charge injection/transport layer included in the first light emitter is different from thickness of the one charge injection/transport layer included in the second light emitter, the alkali metal or alkaline earth metal of the fluoride included in the intermediate layer is a first metal, and a metal included in the second charge injection/transport layer is a second metal, the second metal has a property of cleaving a bond between the first metal and fluorine included in the fluoride of the first metal, and a surface of the intermediate layer is in direct contact with a surface of the second charge injection/transport layer.

14. The light-emitting device of claim 13, wherein
the second metal cleaves the bond between the first metal and the fluorine included in the fluoride of the first metal present on the surface of the intermediate layer.

15. A light-emitting device comprising:
a plurality of light emitters arranged in two dimensions along a surface of a substrate, each light emitter of the plurality of light emitters comprising:
  a first electrode disposed above the substrate;
  a first charge injection/transport layer disposed above the first electrode;
  a light-emitting layer disposed above the first charge injection/transport layer;
  an intermediate layer disposed above the light-emitting layer;
  a second charge injection/transport layer disposed on the intermediate layer; and
  a second electrode disposed above the second charge injection/transport layer,
wherein
the intermediate layer includes a fluoride of an alkali metal or a fluoride of an alkaline earth metal,
among the first electrode and the second electrode, one electrode is light reflective and an other electrode is light transmissive,
the plurality of light emitters include a first light emitter that emits a first color of light and a second light emitter that emits a second color of light that is different from the first color of light,
among the first charge injection/transport layer and the second charge injection/transport layer, one charge injection/transport layer is disposed between the light-emitting layer and the light reflective electrode, and thickness of the one charge injection/transport layer included in the first light emitter is different from thickness of the one charge injection/transport layer included in the second light emitter,
the alkali metal or alkaline earth metal of the fluoride included in the intermediate layer is a first metal, and a metal included in the second charge injection/transport layer is a second metal,
the second metal has a property of cleaving a bond between the first metal and fluorine included in the fluoride of the first metal, and
only one of the first charge injection/transport layer and the second charge injection/transport layer is in contact with the light-emitting layer.

* * * * *